United States Patent
Lazarov et al.

(10) Patent No.: US 10,557,894 B2
(45) Date of Patent: Feb. 11, 2020

(54) REFERENCE SIGNAL CORRECTION CIRCUIT

(71) Applicant: LINEAR TECHNOLOGY HOLDING LLC, Norwood, MA (US)

(72) Inventors: Kalin V. Lazarov, Colorado Springs, CO (US); Robert C. Chiacchia, Colorado Springs, CO (US)

(73) Assignee: Linear Technology Holding LLC, Norwood, MA (US)

( * ) Notice: Subject to any disclaimer, the term of this patent is extended or adjusted under 35 U.S.C. 154(b) by 132 days.

(21) Appl. No.: 15/671,080

(22) Filed: Aug. 7, 2017

(65) Prior Publication Data

US 2019/0041471 A1   Feb. 7, 2019

(51) Int. Cl.
    *G05F 3/02*    (2006.01)
    *G01R 33/00*   (2006.01)
    *H01L 23/00*   (2006.01)

(52) U.S. Cl.
    CPC ..... *G01R 33/0029* (2013.01); *G01R 33/0082* (2013.01); *G05F 3/02* (2013.01); *H01L 23/562* (2013.01)

(58) Field of Classification Search
    CPC . G01R 33/0029; G01R 33/0082; G05F 1/468; G05F 3/02; G05F 3/30; H01L 53/562
    See application file for complete search history.

(56) References Cited

U.S. PATENT DOCUMENTS

| | | | |
|---|---|---|---|
| 6,917,203 B1 | 7/2005 | Perotti et al. | |
| 7,061,325 B2 | 6/2006 | Pitz | |
| 7,302,357 B2 * | 11/2007 | Ausserlechner | H01L 23/34 257/427 |
| 7,437,260 B2 | 10/2008 | Ausserlechner et al. | |
| 7,440,861 B2 | 10/2008 | Ausserlechner et al. | |
| 7,777,475 B2 | 8/2010 | Sperling et al. | |
| 7,932,772 B1 | 4/2011 | Zarabadi | |
| 8,324,881 B2 | 12/2012 | Trifonov et al. | |
| 9,389,126 B2 * | 7/2016 | Kim | G01K 7/00 |
| 9,960,733 B2 | 5/2018 | Motz | |
| 10,103,050 B2 | 10/2018 | Motz | |
| 10,333,463 B2 | 6/2019 | Motz | |
| 2005/0162160 A1 | 7/2005 | Ausserlechner et al. | |
| 2006/0001413 A1 | 1/2006 | Marinca | |

(Continued)

OTHER PUBLICATIONS

International Search Report and Written Opinion from PCT/2017/045974, dated Nov. 27, 2017, 9 pages.

(Continued)

*Primary Examiner* — Patrick O Neill

(74) *Attorney, Agent, or Firm* — Schwegman Lundberg & Woessner, P.A.

(57) ABSTRACT

In a system and method for correcting a stress-impaired signal in a circuit, a calibration circuit produces a first calibrated voltage based on a base-emitter voltage of one or more pnp transistors, a second calibrated voltage based on a base-emitter voltage of one or more npn transistors, and a voltage proportional to absolute temperature. A set of reference values are generated based on these voltages. A gain correction factor is calculated based on a function of the set of reference values and a set of temperature-dependent values, and the stress-impaired signal is corrected based on the gain correction factor.

23 Claims, 5 Drawing Sheets

(56) References Cited

U.S. PATENT DOCUMENTS

| | | |
|---|---|---|
| 2007/0018655 A1 | 1/2007 | Ausserlechner et al. |
| 2008/0111565 A1 | 5/2008 | Ausserlechner et al. |
| 2009/0063081 A1 | 3/2009 | Xu |
| 2016/0238647 A1 | 8/2016 | Motz |
| 2016/0241186 A1 | 8/2016 | Motz |
| 2016/0252409 A1* | 9/2016 | Lu .......................... G01K 7/22 702/99 |
| 2017/0331429 A1 | 11/2017 | Motz |
| 2018/0283964 A1* | 10/2018 | Turullols ................. G01K 7/01 |
| 2019/0013233 A1 | 1/2019 | Motz |

OTHER PUBLICATIONS

Motz, Mario, et al., "Compensation of Mechanical Stress-Induced Drift of Bandgap Reference with On-Chip Stress Sensor", IEEE Sensors Journal, 15(9), (Sep. 2015), 5115-5121.

* cited by examiner

REFERENCE SIGNAL CORRECTION CIRCUIT

BACKGROUND

Bandgap reference circuits are used in systems That require a reference voltage that is relatively accurate and stable. A bandgap reference circuit generally includes two p-n junctions operating at different current densities. The circuit may produce a reference voltage calculated by summing a voltage across one of the junctions with a scaled difference of the voltages across both junctions. Since each junction voltage is inversely proportional to temperature and the scaled difference is directly proportional to temperature, the sum is temperature independent. In a conventional Brokaw bandgap reference circuit, the foregoing voltages are achieved by forcing a current through two bipolar transistors with different emitter areas.

Even though bandgap reference circuits are generally considered to be accurate, mechanical and/or environmental stresses (e.g., caused by circuit packaging and mounting, temperature variations, oxidation, etc.) may cause non-uniformities and voltage instability over time. Accordingly, circuit designers have sought to compensate for such stress-induced inaccuracies.

To reduce sensitivity to package stress, most high-performance voltage references are packaged in expensive open cavity hermetic packages such as ceramic or metal can. Other solutions include implementing a stress gauge using a MOS (metal-oxide-semiconductor) device, or suspending a voltage reference core on a micro-machined membrane. These mechanisms have not produced a consistent stress response, and generally cannot compensate for unstable input signals.

BRIEF DESCRIPTION OF THE DRAWINGS

The accompanying drawings are presented to aid in the description of example aspects and are provided solely for illustration of the embodiments and not limitation thereof.

DETAILED DESCRIPTION

In some circuit applications, certain generated signals may be based on a voltage reference that is subject to stresses, and which cannot be verified as accurate or stable. For example, a circuit may be designed to utilize an external voltage reference that is unknown at the time of design. Another circuit may produce observable signals that, over time, become degraded due to stresses not present at the time of design or implementation. It is desirable to ensure the accuracy of a reference voltage used by a circuit component, or to ensure the accuracy of the output of the component that uses such a reference voltage, irrespective of how the components of the circuit were originally designed or implemented.

The system of the present disclosure provides automatic signal correction that compensates for errors introduced by stresses on the circuit providing the signal. These stresses may occur internal or external to a particular component's packaging. The system of the present disclosure may benefit applications utilizing a signal path, including systems implementing an analog-to-digital converter and/or a voltage reference. An example system is disclosed that implements a calibration circuit, a multiplexer, and a processing unit to facilitate correction of a stress-impaired output signal of an analog-to-digital converter.

In some implementations, the disclosed calibration circuit provides a first calibrated pnp voltage based on a base-emitter voltage of one or more pnp transistors and a second calibrated npn voltage based on a base-emitter voltage of one or more npn transistors. The multiplexer is connected to the calibration circuit and a sense terminal, and provides an analog signal selected from the voltages provided by the calibration circuit and a sense voltage provided by a sense terminal. The analog-to-digital converter generates a digital output signal based on the analog signal provided by the multiplexer and a stress-impaired reference voltage.

The processor is configured to (e.g., based on an instruction set) control the multiplexer to sample the first calibrated voltage, the second calibrated voltage, and the sense voltage for the analog-to-digital converter. The processor receive a set of reference values from the analog-to-digital converter based on the stress-impaired reference voltage and a sampling of the first calibrated voltage and the second calibrated voltage by the multiplexer, and calculates a gain correction factor based on a set of reference values and a set of temperature-dependent values. The disclosed system is configured to adjust the sense voltage output from the analog-to-digital converter based on the gain correction factor to correct for errors introduced by the stress-impaired reference voltage.

Figure 1:
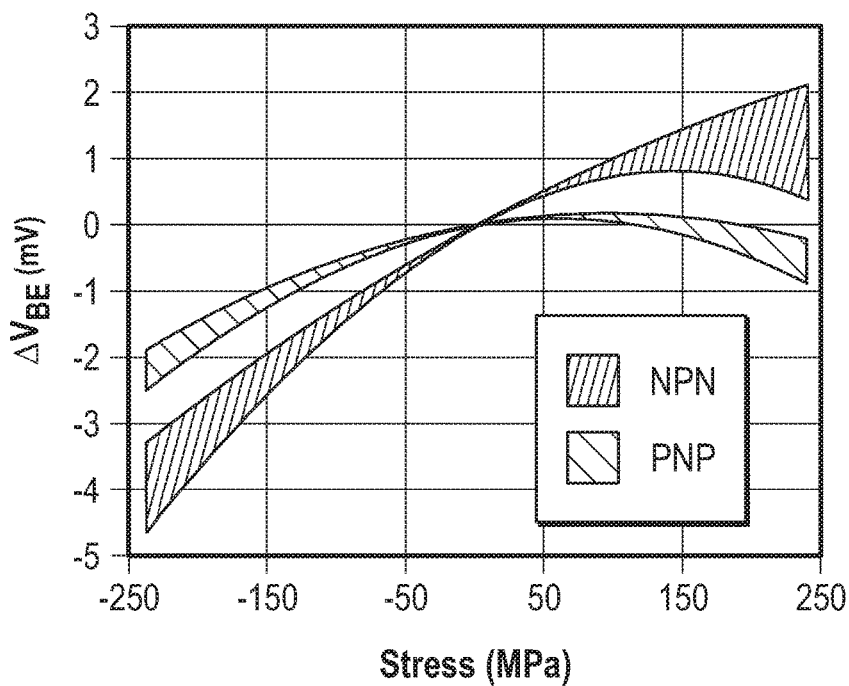
FIG. 1 is a chart depicting exemplary stress sensitivity of vertical pnp and npn devices, according to various aspects of the present disclosure.

FIG. 1 is a chart depicting exemplary stress sensitivity of vertical pnp and npn devices, according to various aspects of the present disclosure. Mechanical stresses on a transistor device are known to directly impact the base-emitter voltage Vbe of the transistor. This phenomenon is known as the piezojunction effect, and is a known cause of inaccuracies in precision-critical devices that utilize transistors.

The piezojunction effect and its relationship between Vbe and stress are depicted in FIG. 1. There is a known relative change in the voltage potential between base and emitter Vbe for respective vertical npn and pnp devices as a function of stress. Under certain circumstances, the stress sensitivity of a pnp device under compressive stress is known to be approximately half of the stress sensitivity of an npn device.

Conventional bandgap and temperature sensing devices have sought to study the piezojunction effect relative to a piezoresistive effect, which measures a change in a resistivity of a semiconductor or metal when mechanical strain is applied. The calibration bandgap circuit disclosed herein uses the difference in stress sensitivities of both pnp and npn for compensation. Both npn and pnp devices are sub-surface devices, and the correlation between their stress response is significantly better than the correlation between a bipolar device and a MOS device (e.g., surface current, shallow trench isolation stress), or a bipolar device and a polysilicon resistor in the metal stack, away from the silicon substrate). In this regard, the disclosed calibration circuit derives an absolute change in a bandgap voltage from stress on a pnp circuit, as well as a change in a npn circuit. Outputs of both sub-circuits are then utilized, and a difference between the npn and pnp bandgap references is used in stress calibration.

Figure 2:
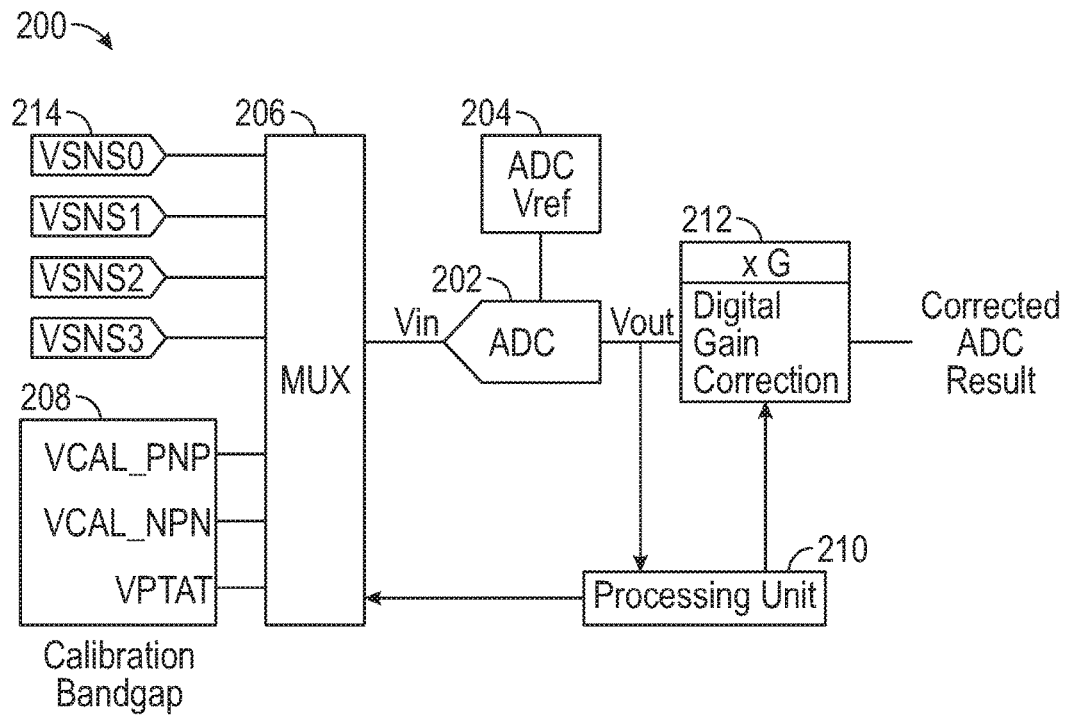
FIG. 2 is a diagram of an example system that corrects errors introduced by stresses on components of the system, according to various aspects of the present disclosure.

FIG. 2 is a diagram of an example system 200 that corrects errors introduced by stresses on components of the system, according to various aspects of the present disclosure. Analog-to-digital converters (ADCs) are one application in which results are dependent upon the accuracy of a voltage reference. For example, ADCs often require a voltage reference input, and the accuracy of the reference may directly influence the accuracy of the converter output. In the depicted example, an ADC 202 uses a Vref 204 that cannot be verified as accurate or stable. The output of the ADC is corrected based on a combination of npn and pnp bandgap references.

System 200 includes ADC 202, a Vref 204, a multiplexer (MUX) 206, a calibration circuit 208, a processing unit 210, and a digital gain correction buffer 212 (e.g., a cache or other memory). In some aspects, one or more these components may be integrated into a single chip. For example, ADC 202, MUX 206, calibration circuit 208, processing unit 210, and buffer 212 may be integrated as a single component and/or chip. In other aspects, the components may be implemented on two or more discrete components and/or chips.

Processing unit 210 may include a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. Processing unit 210 may be configured to execute code or instructions to perform the operations and functionality described herein. For example, processing unit 210 may be configured to perform calculations and generate commands. In some implementations, one or more sequences of instructions may be stored as firmware on memory within processing unit 210. In some implementations, one or more sequences of instructions may be software stored and read from a storage medium (not shown).

Processing unit 210 may monitor and control the operation of the components in system 200, including MUX 206. For example, processing unit 210 may select respective input MUX channels for input to ADC 202, sample the output of ADC 202, and perform operations on multiple outputs based on multiple input MUX selections to generate a result. The result may be stored and/or updated within buffer 212.

ADC 202 may be a conventional measurement device that converts an input analog voltage Vin (or current) to a digital representation proportional to the magnitude of the input voltage (or current). In the depicted example, the output digital signal Vout is computed based on a function of Vin and reference voltage Vref. ADC 202 may sample multiple input voltages using MUX 206.

According to various implementations, system 200 is configured to calibrate a stress-impaired output signal, such as that produced by ADC 202. As will be described further, calibration circuit 208 provides a first calibrated pnp voltage Vcal_pnp based on a base-emitter voltage of one or more pnp transistors and a second calibrated npn voltage Vcal_ npn based on a base-emitter voltage of one or more npn transistors. One or more sense terminals 214 may provide one or more respective sense voltages Vsns_n. In the depicted example, multiplexer 206 is connected to the calibration circuit and one or more sense terminals 214, and configured to provide an analog signal selected from one of a sense voltage, the first calibrated pnp voltage Vcal_pnp, and the second calibrated npn voltage Vcal_npn. ADC 202 is configured in the system to generate a digital output signal based on the analog signal selected by the multiplexer and reference voltage Vref 204 (which may be a stress-impaired reference voltage).

Processing unit 210 controls the multiplexer to sample the first calibrated voltage, the second calibrated voltage, and the sense voltage Vsns_n for the analog-to-digital converter. The sampling may be performed according to a clock signal (not shown) or other timing mechanism. In this regard, ADC 202 generates a set of reference values based on the stress-impaired reference voltage and a sampling of the first calibrated pnp voltage Vcal_pnp and the second calibrated npn voltage Vcal_npn (the "calibration voltages") by the multiplexer. Processing unit 210 receives the set of reference values from ADC 202 (e.g., via a signal bus) and calculates a gain correction factor G based on a set of reference values and a set of temperature-dependent values. As will be described further, the set of temperature-dependent values may be determined in real time based on the sampled values by ADC 202 and a predetermined algorithm, or may include predetermined values calculated based on training data.

The calculated gain correction factor G is used to adjust the digital output signal Vout, to correct for errors introduced by stress on the system (including, e.g., from the stress-impaired reference Vref 204). The gain correction factor G is calculated to bring the error in the measurement of sense voltage Vsns_n to zero. In this regard, G=Vref/Vref(ideal) and effectively self-calibrates the lower precision Vref. Accordingly, processing unit 210 operates multiplexer 206 to read and convert both the sense voltage Vsns_n it is seeking to correct as well as the real-time calibration voltages used to correct the sense voltages, with both the sense voltages and the calibration voltages potentially being impaired by the same stress factors.

To calculate the gain correction factor G, processing unit 210 may first initialize a device temperature parameter to a predetermined default temperature (e.g., T=300 K), and an initial gain correction value to a default gain correction value (e.g., G=1). The multiplexer 206 is controlled to sample the calibration voltages Vcal_pnp and Vcal_npn. In some implementations, multiplexer 206 is further controlled to sample a voltage that is proportional to absolute temperature (PTAT) Vptat. Vptat may be based on the base-emitter voltage of the one or more pnp transistors of calibration circuit 208. ADC 202 continuously samples and converts the calibrated bandgap voltages Vptat, Vcal_npn, and Vcal_pnp to corresponding reference values c0, c1, and c2.

The set of temperature-dependent values used in the previously-described calculation of gain correction factor G may be determined based on a current value of T. In some implementations, processing unit 201 may determine temperature-dependent values $\beta 0(T)$, $\beta 1(T)$, and $\beta 2(T)$ corresponding to reference values c0, c1, and c2 generated by ADC 202. A temperature-dependent value $\alpha(T)$ may also be determined. These temperature-dependent values may be determined by indexing a lookup table based on a current device temperature T, or may be calculated in real time based on sampled values. Each of these values may be initially set to a default value.

According to various implementations, device temperature T for system 200 may be calculated based on a first of the reference values c0 and the initial gain correction factor and, in some implementations, further based on the predetermined temperature-dependent value α(T). For example, processing unit 210 may calculate the device temperature according to the equation:

$$T = \alpha(T) G c0 \quad (1)$$

where α(T) is a previously calculated or default T, and G is a previously-calculated or default G.

In some implementations, processing unit 210 calculates the new gain correction factor by multiplying the each temperature-dependent value in the set of temperature-dependent values by a respective reference value of the set of reference values, summing each result, and determining a reciprocal of the sum. For example, processing unit 210 may calculate the new gain correction factor according to the equation:

$$G = 1/(\beta 0(T) c0 + \beta 1(T) c1 + \beta 2(T) c2) \quad (2)$$

In some implementations, the calculations of temperature T, temperature-dependent values β0(T), β1(T), β2(T), and α(T), and gain correction factor G are repeated until temperature T and gain correction factor G converge to respective values (e.g., according to a predetermined convergence algorithm). The (uncorrected) output signal Vout of ADC 202 may then be corrected by multiplying the magnitude of the output signal Vout by gain correction factor G. In some implementations, processing unit 210 may store a final value of T, and provide T as an output value. Since device temperature T by way of the calculations described herein (and/or, e.g., by way of convergence) becomes a corrected value, system 200 may function as a stress-compensated integrated temperature sensor by providing T as an output value.

In some implementations, processing unit 210 determines the gain correction factor G from one or more polynomial equations. For example, processing unit 201 may determine temperature-dependent values β0(T), β1(T), and β2(T), and α(T), in the forgoing manner. The polynomial equations may be generated based on the set of temperature-dependent values, the set of reference values c0, c1, and c2, the calibrated bandgap voltages Vptat, Vcal_npn, and Vcal_pnp, and the stress-impaired reference voltage Vref. The polynomial equations may then be solved for unknowns G and a change in stress Δσ, as described further below.

ADC 202 continuously samples and converts a set of calibration voltages selected by multiplexer 208 from calibration circuit 208 to reference values c0, c1, and c2. One or more of these calibration voltages may be a linear combination of a base-emitter voltage of the one or more transistors and a PTAT voltage. In some implementations, the linear combination may include other voltage components such as curvature-compensation voltages. According to various implementations, the set of reference values are based on at least one base-emitter voltage derived from a pnp transistor and at least one base-emitter voltage derived from an npn transistor.

Figure 3A:
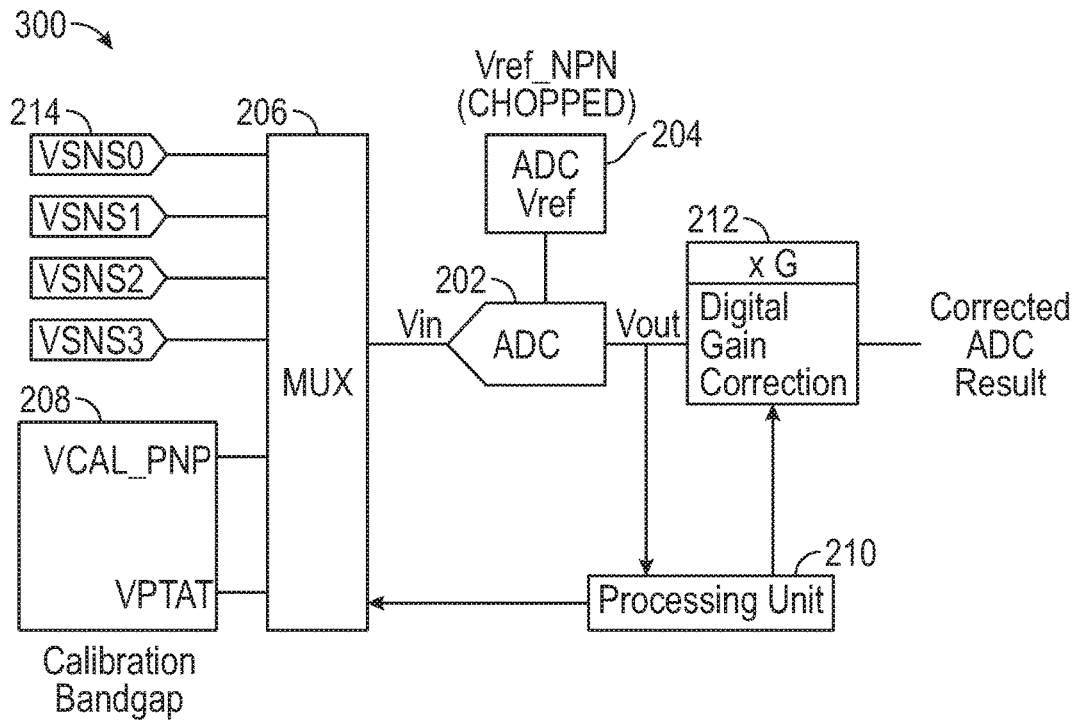
FIGS. 3A and 3B are diagrams of further example systems that correct errors introduced by environmental and mechanical stresses, according to various aspects of the present disclosure.
Figure 3B:
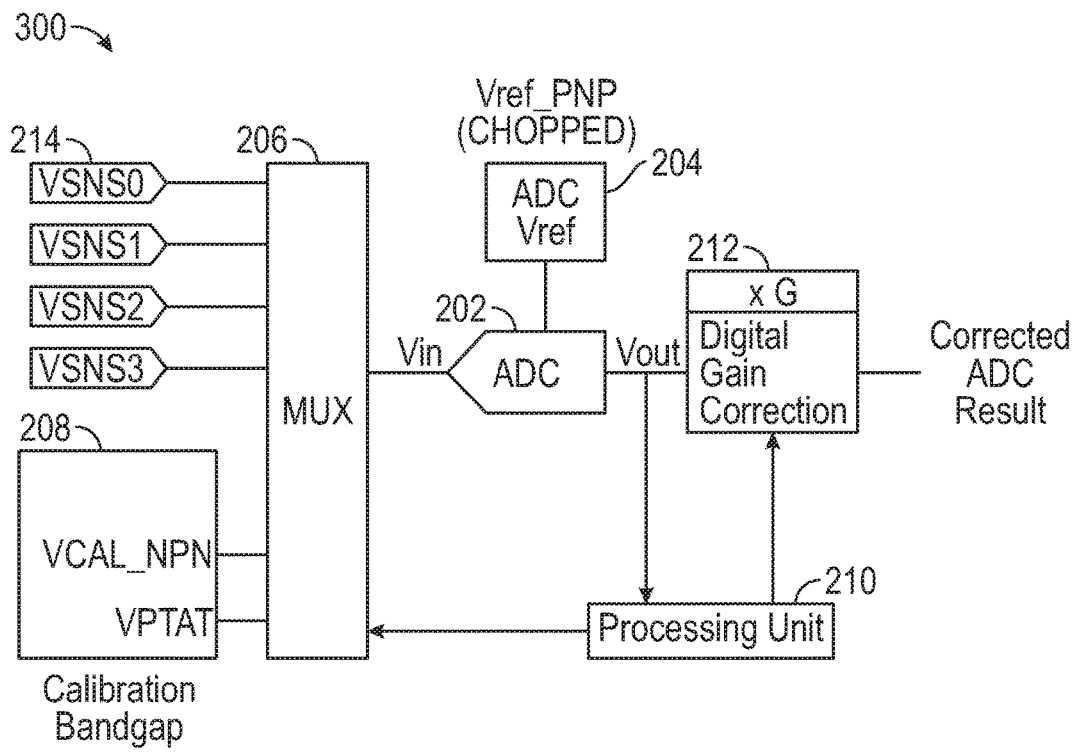

FIGS. 3A and 3B are diagrams of further example systems 300 that correct errors introduced by environmental and mechanical stresses, according to various aspects of the present disclosure. In these example implementations, the set of reference values omit one of the previously-described base-emitter voltages, and instead include a combination of a reference value based on a base-emitter voltage derived from a pnp transistor and a reference value based on a pure PTAT voltage (FIG. 3A), or a combination of a reference value based on a base-emitter voltage derived from an npn transistor and a reference value based on a pure PTAT voltage (FIG. 3B).

In the depicted examples, calibration circuit 208 generates calibration bandgap voltages Vptat and Vcal_npn, or Vptat and Vcal_pnp. Reference values c0 and c1 are generated by ADC 202, and temperature-dependent values β0(T), β1(T), and α(T) are determined, as described with regard to FIG. 2. In some implementations, gain correction factor G may be calculated by solving for unknown polynomial equations based on these determined values. In some implementations, gain correction factor G may be calculated by multiplying the each temperature-dependent value (e.g., β0(T) and β1(T)) by a respective reference value (e.g., c0 and c1), summing each result, and determining a reciprocal of the sum.

With regard to FIGS. 3A and 3B, the type of calibration circuit 208 used in a system 300 may be based on the component type of ADC Vref 204. In this regard, the calibration voltage omitted from calibration circuit 208 may be complimentary to the bipolar type implemented by ADC Vref 204. For example, if Vref 204 is derived from npn devices then a calibration circuit 208 may be used that omits Vcal_npn and implements Vcal_pnp. If Vref 204 is derived from pnp devices then a calibration circuit 208 may be used that omits Vcal_pnp and uses Vcal_npn. In other words, if calibration circuit 208 omits Vcal_npn then ADC Vref 204 may be based on npn devices. If calibration circuit 208 omits Vcal_pnp then ADC Vref 204 may be based on pnp devices.

Figure 4:
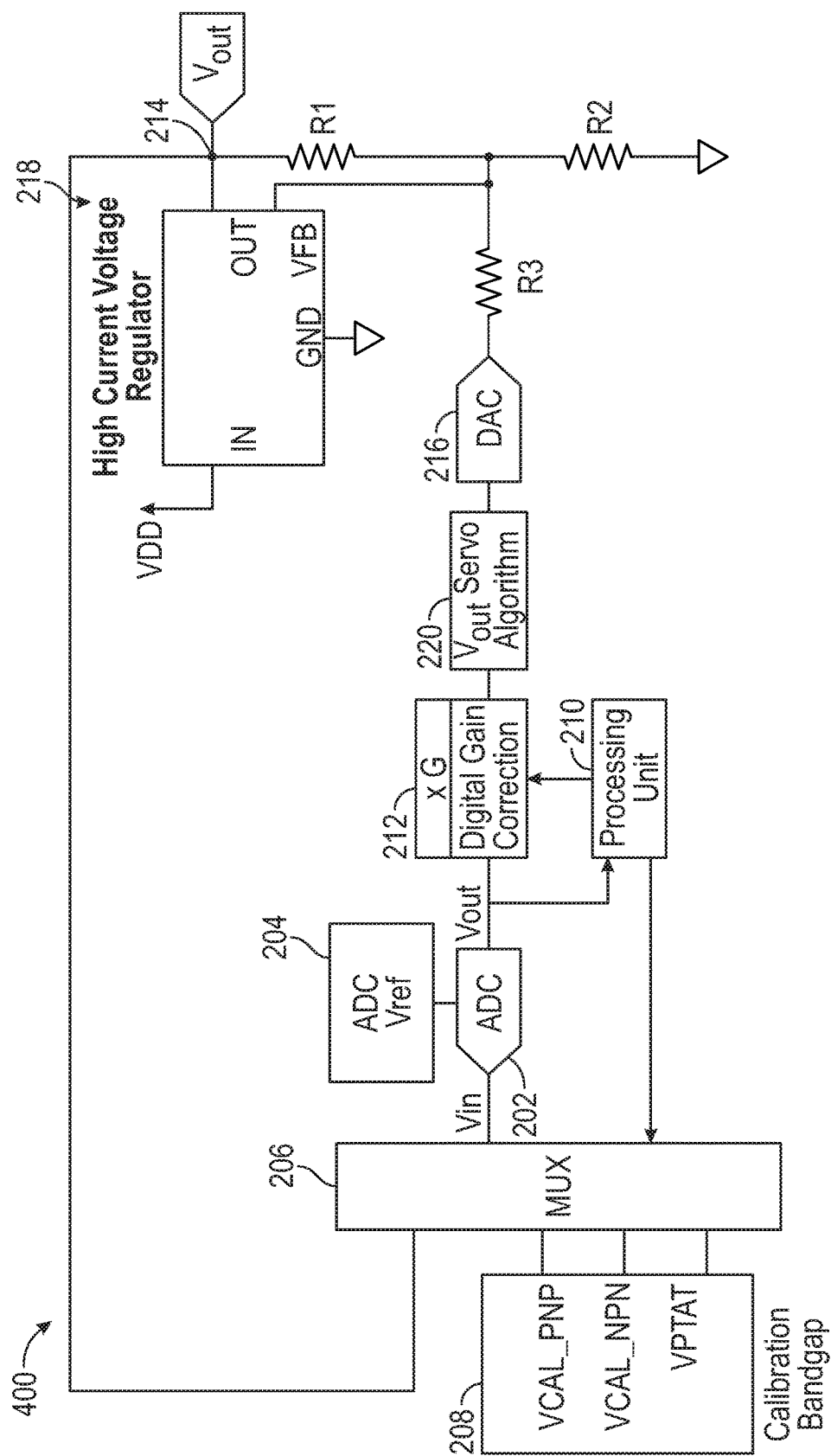
FIG. 4 is a diagram of an example system that corrects an output voltage of a regulator due to stress-impaired signals introduced into a regulator, according to various aspects of the present disclosure.

FIG. 4 is a diagram of an example system 400 that corrects an output voltage of a regulator due to stress-impaired signals introduced into a regulator, according to various aspects of the present disclosure. As described with respect to FIGS. 2 and 3, system 400 includes an ADC 202, a Vref 204, a multiplexer (MUX) 206, a calibration circuit 208, a processing unit 210, and a digital gain correction buffer 212. System 400 also includes a digital-to-analog converter (DAC) 216 and voltage regulator circuit 218.

System 400 is coupled to regulator circuit 218 to correct the output Vout of the regulator circuit. In the depicted example, multiplexer 206 is connected to calibration circuit 208 and regulator output voltage Vout as a sense terminal 214, and configured to provide an analog signal selected from one of regulator output voltage Vout, the first calibrated pnp voltage Vcal_pnp, and the second calibrated npn voltage Vcal_npn.

In the depicted example, DAC 216 receives the corrected output of ADC 202 based on a servo loop control algorithm 220. Algorithm 220 controls the sequencing, timing, and computational capabilities of a servo loop. In some implementations, servo loop control algorithm 220 is executed by processing unit 210. In some implementations the algorithm is implemented in a servo loop controller (at reference 220 in FIG. 4), positioned between ADC 202 and DAC 216 to receive the corrected output of ADC 202. The output of ADC 202 or digital servo controller 220 is converted to analog form by a DAC 216, and is further provided to regulator circuit 218 as a reference voltage. In some implementations, the precision of the digital to analog conversion is due to a relatively slow servo loop. The voltage regulator is configured, by way of the servo loop, to handle fast output transients and load/line regulation.

Those skilled in the art will appreciate that information and signals produced by or within the systems and circuits described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Figure 5:
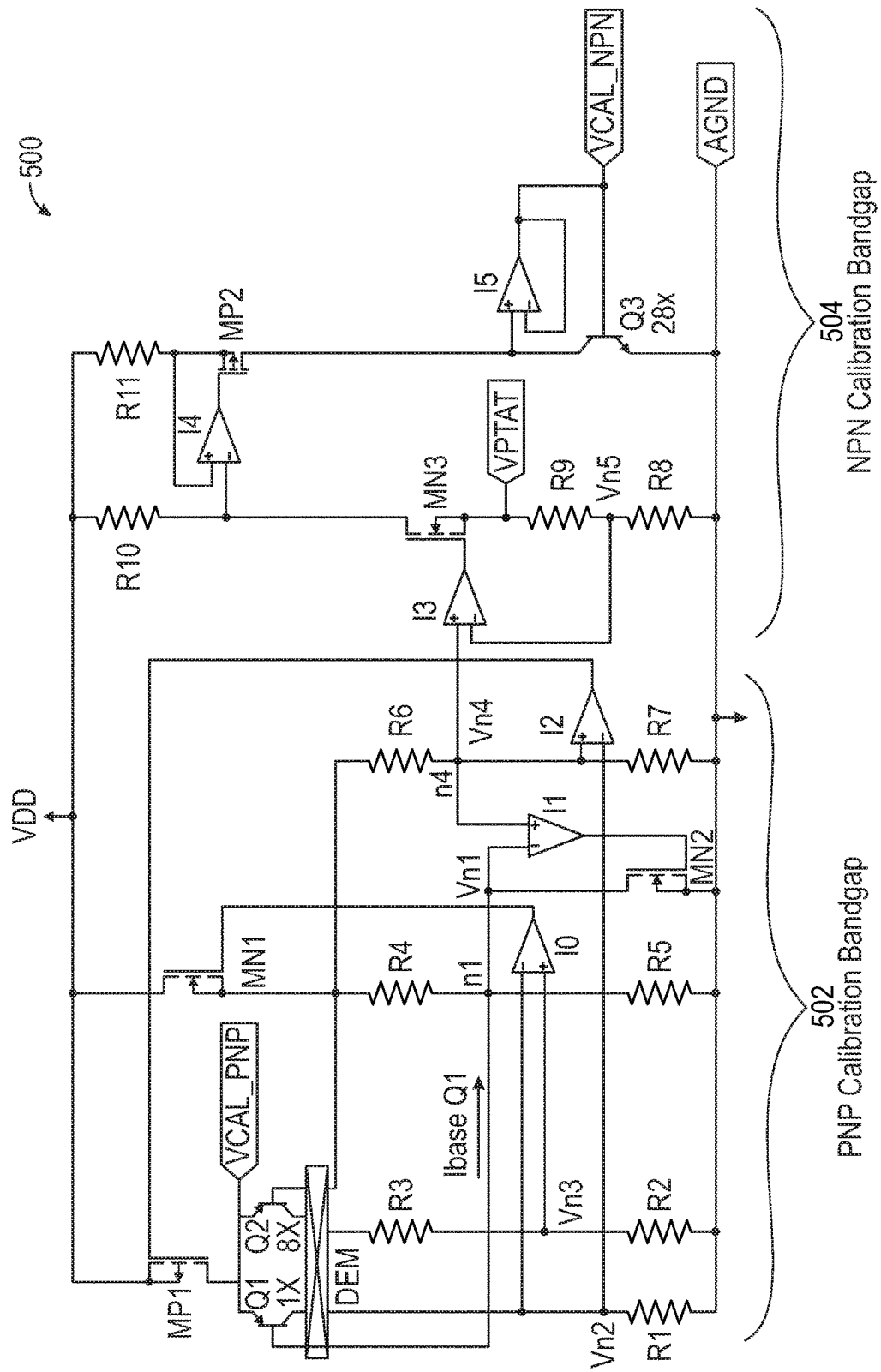
FIG. 5 depicts an example circuit for generating stress-compensated bandgap voltage references, according to various aspects of the present disclosure.

FIG. 5 depicts an example circuit 500 for generating stress-compensated bandgap voltage references, according to various aspects of the present disclosure. In the depicted example, two very high-precision bandgap voltage references are created—one implemented by a first reference circuit 502 with vertical pnp transistors, and a second reference circuit 504 with a vertical npn transistor. The two device types respond to the same or similar stresses, with different sensitivity, and based on the deviation between the two trimmed bandgap references, circuit 500 may facilitate estimation and/or correction of the absolute error of an effective voltage reference due to a change in stress of the overall circuit. Circuit 500 also generates a calibrated reference voltage that is proportional-to-temperature (Vptat).

Reference circuit 502 generates a voltage reference Vcal_pnp. Reference circuit 502 includes first and second pnp transistors, Q1 and Q2, in a matched pair configuration (e.g., in a current mirror configuration or differential pair configuration). In the depicted example, reference circuit 502 implements Q1 and Q2 in a differential pair configuration. The emitter areas of each transistor may be different with, e.g., the emitter area of Q2 being N times the emitter area of Q1. In the depicted example, N=8. Transistors Q1 and Q2 are connected in parallel at their emitters to a common current source MP1. In the depicted example, MP1 is a p-channel mosfet. For the purpose of this disclosure, the acronym "MP" is used to designate a p-channel mosfet, while the acronym "MN" is used to designate an n-channel mosfet. It is understood that the types of mosfets used may be interchangeable with minor circuit variations.

According to some implementations, a dynamic element matching component DEM may be connected at the respective bases and collectors of Q1 and Q2, and is configured to employ dynamic element matching to cycle between the transistors of the matched input pair to compensate for localized stress effects. The collector currents I1 and I2 through R1, and R2 and R3, respectively may be held constant and equalized.

Resistors R4 and R5 function as a voltage divider, creating a voltage potential Vn1 at node n1 to bias Q1, and a base current IbaseQ1 sums into node n1 (between R4 and R5) from the base of Q1, creating a beta sensitivity (e.g., at the base of Q2). The R4/R5 voltage divider is powered by a current flowing through a current source MN1. MN1 is controlled by amplifier I0, and a difference between voltage potentials Vn2 and Vn3 across R1 and R2, respectively.

A voltage potential Vn4 is created based on an output of a second voltage divider, which divides voltages across resistors R6 and R7 connected to the base of Q2. When operational, MN2 draws an equal amount of current away from R5. MN2 is controlled by amplifier I1 and a difference between voltage potentials Vn1 and Vn4. According to various implementations, MN2 draws a current Imn2 that is equal to the current IbaseQ1 (through the base of Q1). By removing Imn2 from node n1—and thus R5—the voltage drop across R5 (e.g., measured at Vn4) accurately represents a proportional-to-temperature (PTAT) voltage without base current errors.

According to various implementations, the amplifier I2 controls current source MP1 based on a difference between, e.g., voltage potential Vn4 and voltage potential Vn2 (across R1). In this regard, amplifier I2 forces the collector currents of Q1 and Q2 to be PTAT, in addition to the collector currents being equal.

Second reference 504 circuit includes an amplifier I3 which controls MN3 based on, e.g., a difference between Vn4 and an a voltage divider output Vn5 based on resistors R8 and R9. When MN2 draws a current Imn2 (e.g., equal to or based on IbaseQ1), node n1 (between R4 and R5) and node n4 (between R6 and R7) are forced to the same (PTAT) potential. Vn4 may then be mirrored and gained upward by amplifier I3 and MN3 (e.g., based on the values selected for R8, R9, and R10) to generate Imn3. A PTAT voltage potential across resistors R8 and R9 is generated and output as a PTAT reference voltage Vptat.

Reference circuit 504 further generates a voltage reference Vcal_npn. Reference circuit 504 includes a current mirror in which PTAT current Imn3 is copied by amplifier I4 and MP2 as a PTAT current Imp2. Amplifier I5 is configured as a unity buffer to maintain equal emitter and collector voltages of the npn transistor Q3. The emitter area of Q3 may be different than the emitter area of Q1 and Q2, e.g., with the emitter area of Q3 being X times the emitter area of Q1. In the depicted example, X=28. PTAT current Imp2 creates a base-emitter voltage potential in Q3, which is also PTAT and output as Vcal_npn.

In addition to the global package stresses, the silica particles in the mold compound fill used in plastic packages may create point stresses on the device surface. The variation of the point stresses over time and temperature can result in significant change in the absolute voltage of the bandgap reference. In some instances, if a silica particle applies stress directly over the 1x device in a bandgap core of the device, the device can exhibit aberrant performance over temperature. To mitigate this effect, some processes offer relatively thick conformal coatings over the die surface such as polyimide or PBO. To reduce the effects of local stresses even further, some implementations of circuit 500 may alternate the position of Q1 (e.g., within the die). By using spatial averaging, the effective bandgap voltage may correspond to an average stress in the bandgap core. The npn devices Q3 may be located inside a Q1/Q2 array in a centroid fashion in order to be subjected to the same average stress as the pnp devices.

As described previously, the subject technology determines temperature-dependent values $\beta 0(T)$, $\beta 1(T)$, and $\beta 2(T)$ corresponding to reference values c0, c1, and c2 generated by ADC 202. These temperature-dependent values may be determined from a lookup table based on a current temperature T, or may be calculated in real time based on sampled values, and may be used in a calculation of gain correction factor G. Additionally or in the alternative, polynomial equations may be solved for unknowns G and a change in stress $\Delta \sigma$. These polynomial equations may also be based on a combination of the set of temperature-dependent values (e.g., $\beta 0(T)$, $\beta 1(T)$, $\beta 2(T)$, and $\alpha(T)$), the set of reference values (e.g., c0, c1, and c2), a stress-impaired reference voltage Vref, in addition to the calibration bandgap voltages (e.g., Vptat and Vcal_npn and/or Vcal_pnp).

The following examples are provided to explain how the set of temperature-dependent values and/or the polynomial equations used to solve for G may be developed (e.g., based on real time values or on training data).

First Example Implementation

Using the three voltages $V_{PTAT}$, $V_{CALNPN}$ and $V_{CALPNP}$ generated by the calibration circuit 208, two high-precision bandgap references can be defined (with the coefficients $g_1$ and $g_2$ may be a function of the design):

$$V_{BG_{NPN}} = V_{CAL_{NPN}} + g_1 V_{PTAT} \qquad (3)$$

$$V_{BG_{PNP}} = V_{CAL_{PNP}} + g_2 V_{PTAT}$$

$$T = \alpha \frac{V_{PTAT}}{V_{REF(Ideal)}}$$

Coefficients $g_1$ and $g_2$ may be a function of the design and $\alpha$ is a final trim coefficient. The temperature T can be calculated from a final test trim coefficient $\alpha$ and an ideal reference voltage $V_{REF(Ideal)}$. In the following derivation all parameters are a function of the device temperature T, with the exception of $V_{REF(Ideal)}$. The synthesized voltage references $V_{BG_{NPN}}$ and $V_{BG_{PNP}}$ are affected by many circuit error sources, an initial package stress (e.g., represented by coefficient $\sigma_{trim}$) determined when the device was trimmed at final test, and a change in stress due to aging of the package and the additional board-mounting stress $\Delta\sigma$.

Using the example circuit topology of FIG. 5, and chopping and dynamic element matching, the bandgap voltages can be made insensitive to circuit imperfections. Over time, the stress transmitted to the bandgap core will change by $\Delta\sigma$, and the voltage references $V_{BG_{NPN}}$ and $V_{BG_{PNP}}$ will change according to the following equation:

$$V_{BG_{NPN}} = V_{BG_{NPN}(Trim)} + V_{REF(Ideal)} \sum_{n=1}^{N} a_n (\Delta\sigma)^n$$

$$V_{BG_{PNP}} = V_{BG_{PNP}(Trim)} + V_{REF(Ideal)} \sum_{n=1}^{N} b_n (\Delta\sigma)^n \qquad (4)$$

where $a_n$ and $b_n$ are example stress sensitivity coefficients (which may be different), and $V_{REF(Trim)}$ and $V_{CAL(Trim)}$ are the respective values when the device is subject to initial package stress and trimmed according to a final test coefficient.

During normal operation, ADC 202 may measure the ratio between the three voltages $V_{CAL_{NPN}}$, $V_{CAL_{PNP}}$ and $V_{PTAT}$ produced by the calibration bandgap voltages and the ADC reference voltage 204 ($V_{REF}$) with very high precision, even though the absolute value of $V_{REF}$ may have large errors:

$$c_0 = \frac{V_{PTAT}}{V_{REF}} \qquad (5)$$

$$c_1 = \frac{V_{CAL_{NPN}}}{V_{REF}}$$

$$c_2 = \frac{V_{CAL_{PNP}}}{V_{REF}}$$

The ADC reference values $c_0$, $c_1$ and $c_2$ corresponding to the conversion of the three calibration bandgap voltages may be used to calculate the following ratios (substituting (5) in (3)):

$$\frac{V_{BG_{NPN}}}{V_{REF}} = c_1 + g_1 c_0 \qquad (6)$$

$$\frac{V_{BG_{PNP}}}{V_{REF}} = c_2 + g_2 c_0$$

In one example, the ADC gain correction factor G used in the digital gain correction block in FIG. 2 is determined to scale the non-ideal ADC output code$c_{ADC}$:

$$G = \frac{V_{REF}}{V_{REF(Ideal)}} \qquad (7)$$

$$c_{ideal} = \frac{V_{ADC}}{V_{REF(Ideal)}} = G\left(\frac{V_{ADC}}{V_{REF}}\right) = G c_{ADC}$$

The initial values of the bandgap voltages at final test may be stored in memory as the ratios $g_3$, $g_4$:

$$g_4 = \frac{V_{BG_{PNP}(Trim)}}{V_{REF(Ideal)}} \qquad (8)$$

$$g_3 = \frac{V_{BG_{NPN}(Trim)}}{V_{REF(Ideal)}}$$

Substituting (5) in (6) yields:

$$\frac{V_{BG_{NPN}(Trim)}}{V_{REF}} = \frac{g_3}{G} \qquad (9)$$

$$\frac{V_{BG_{PNP}(Trim)}}{V_{REF}} = \frac{g_4}{G}$$

Dividing (4) by $V_{REF}$ and substituting (6) and (9) yields two polynomial equations for the two unknowns G and $\Delta\sigma$:

$$c_1 + g_1 c_0 = \frac{g_3}{G} + \frac{1}{G} \sum_{n=1}^{N} a_n (\Delta\sigma)^n \qquad (10)$$

$$c_2 + g_2 c_0 = \frac{g_4}{G} + \frac{1}{G} \sum_{n=1}^{N} b_n (\Delta\sigma)^n$$

In some implementations, the two equations can be solved by eliminating the gain correction factor G first and then finding the $\Delta\sigma$ from the roots of an n-th degree polynomial:

$$\sum_{n=1}^{N} \left( \frac{a_n}{c_1 + g_1 c_0} - \frac{b_n}{c_2 + g_2 c_0} \right) (\Delta\sigma)^n + \left( \frac{g_3}{c_1 + g_1 c_0} - \frac{g_4}{c_2 + g_2 c_0} \right) = 0 \qquad (11)$$

In some implementations, a first order approximation (N=1) may be used, and thus the equations may simplify to:

$$G(c_1 + g_1 c_0) - g_3 = a_1 \Delta\sigma$$

$$G(c_2 + g_2 c_0) - g_4 = b_1 \Delta\sigma \qquad (12)$$

For example, the closed form solution for the gain correction factor G may be a simple multiply and accumulate operation (MAC) between the ADC conversion codes $c_0$, $c_1$ and $c_2$ and the trim coefficients $\beta_0$, $\beta_1$ and $\beta_2$, followed by an inversion:

$$\frac{1}{G} = \beta_0 c_0 + \beta_1 c_1 + \beta_2 c_2 \qquad (13)$$

where, in some implementations:

$$\beta_0 = \frac{g_1 - g_2\left(\frac{a_1}{b_1}\right)}{g_3 - g_4\left(\frac{a_1}{b_1}\right)} \quad (14)$$

$$\beta_1 = \frac{1}{g_3 - g_4\left(\frac{a_1}{b_1}\right)}$$

$$\beta_2 = \frac{1}{g_4 - g_3\left(\frac{b_1}{a_1}\right)}$$

All trim coefficients in the foregoing examples may be a function of the temperature T. Accordingly, an equation solver may start by estimating the temperature using the uncorrected voltage reference: $T'=\alpha V_{PTAT}/V_{REF}$. All trim coefficients $\beta_0$, $\beta_1$, and $\beta_2$ may be calculated as temperature-dependent values at the estimated temperature T' and then the gain correction factor G determined. The next iteration for the temperature estimate may be $T=\alpha G V_{PTAT}/V_{REF}$, and the process may be performed a few times until the solutions for G and T converge.

To summarize, a first order stress-compensation algorithm implemented by the subject technology may include:
1. Initialize the temperature to T=300K (value is not critical, should be in the normal operating conditions).
2. Initialize the gain correction factor to G=1.
3. Using the ADC, convert the calibration bandgap voltages $V_{PTAT}$, $V_{CAL_{NPN}}$ and $V_{CAL_{PNP}}$ and to get the ADC codes $c_0$, $c_1$ and $c_2$.
4. Calculate the temperature $T=\alpha(T)Gc_0$.
5. Using digital lookup tables, calculate the values of the temperature-dependent trim coefficients $\beta_0(T)$, $\beta_1(T)$ and $\beta_2(T)$ and $\alpha(T)$.
6. Calculate $x=\beta_0(T)c_0+\beta_1(T)c_1+\beta_2(T)c_2$.
7. Calculate $G=1/x$.
8. Repeat steps (4-7) until the estimates for T and G converge.

Second Example Implementation

When the ADC reference $V_{REF}$ (204) is based on a high-precision bandgap voltage (e.g., npn or pnp) and calibration circuit 208 is based on a complementary bipolar type, producing the voltages $V_{CAL}$ (e.g., Vcal_pnp or Vcal_npn) and $V_{PTAT}$, the stress compensation may require only two ADC conversions:

$$c_0 = \frac{V_{PTAT}}{V_{REF}} \quad (15)$$

$$c_1 = \frac{V_{CAL}}{V_{REF}}$$

The temperature T may be calculated from the final test trim coefficient $\alpha$ and the ideal reference voltage $V_{REF(Ideal)}$. In the following derivation all parameters are a function of the device temperature T, with the exception of $V_{REF(Ideal)}$.

$$T = \alpha \frac{V_{PTAT}}{V_{REF(Ideal)}} \quad (16)$$

When high-precision design techniques are used, the stress-dependence of the $V_{REF}$ and $V_{CAL}$ voltages may include:

$$V_{REF}=V_{REF(Trim)}+V_{REF(Ideal)}\Sigma_{n=1}^{N} a_n(\Delta\sigma)^n$$

$$V_{CAL}=V_{CAL(Trim)}+V_{REF(Ideal)}\Sigma_{n=1}^{N} b_n(\Delta\sigma)^n \quad (17)$$

Where $a_n$ and $b_n$ are example stress sensitivity coefficients, and $V_{REF(Trim)}$ and $V_{CAL(Trim)}$ are the respective values when the device is subject to initial package stress and trimmed according to a final test coefficient.

Dividing the first equation in (17) by $V_{REF(Ideal)}$ yields:

$$G = \frac{V_{REF}}{V_{REF(Ideal)}} = \frac{V_{REF(Trim)}}{V_{REF(Ideal)}} + \sum_{n=1}^{N} a_n(\Delta\sigma)^n \quad (18)$$

Dividing the second equation in (17) by the first equation in (17) yields:

$$c_1 = \frac{V_{CAL}}{V_{REF}} = \frac{V_{CAL(Trim)} + V_{REF(Ideal)}\sum_{n=1}^{N} b_n(\Delta\sigma)^n}{V_{REF(Trim)} + V_{REF(Ideal)}\sum_{n=1}^{N} a_n(\Delta\sigma)^n} \quad (19)$$

$$c_1 = \frac{V_{CAL}}{V_{REF}} = \frac{\frac{V_{CAL(Trim)}}{V_{REF(Ideal)}} + \sum_{n=1}^{N} b_n(\Delta\sigma)^n}{G} \quad (20)$$

The two coefficients $\beta_0(T)=V_{REF(Trim)}/V_{REF(Ideal)}$ and $\beta_1(T)=V_{CAL(Trim)}/V_{REF(Ideal)}$ may be determined at final test, and may be used to derive a polynomial system of equations for G and $\Delta\sigma$ by substituting $\beta_0(T)$ and $\beta_1(T)$ in (18) and (20), respectively:

$$G = \beta_0(T) + \sum_{n=1}^{N} a_n(\Delta\sigma)^n \quad (21)$$

$$c_1 G = \beta_1(T) + \sum_{n=1}^{N} b_n(\Delta\sigma)^n$$

A next iteration for a temperature estimate can be calculated after the gain correction factor G is determined from (25) and may include the equation $T=\alpha(T)Gc_0$. The foregoing process may be performed until G and T converge to respective stable values (e.g., according to a predetermined convergence algorithm).

Figure 6:
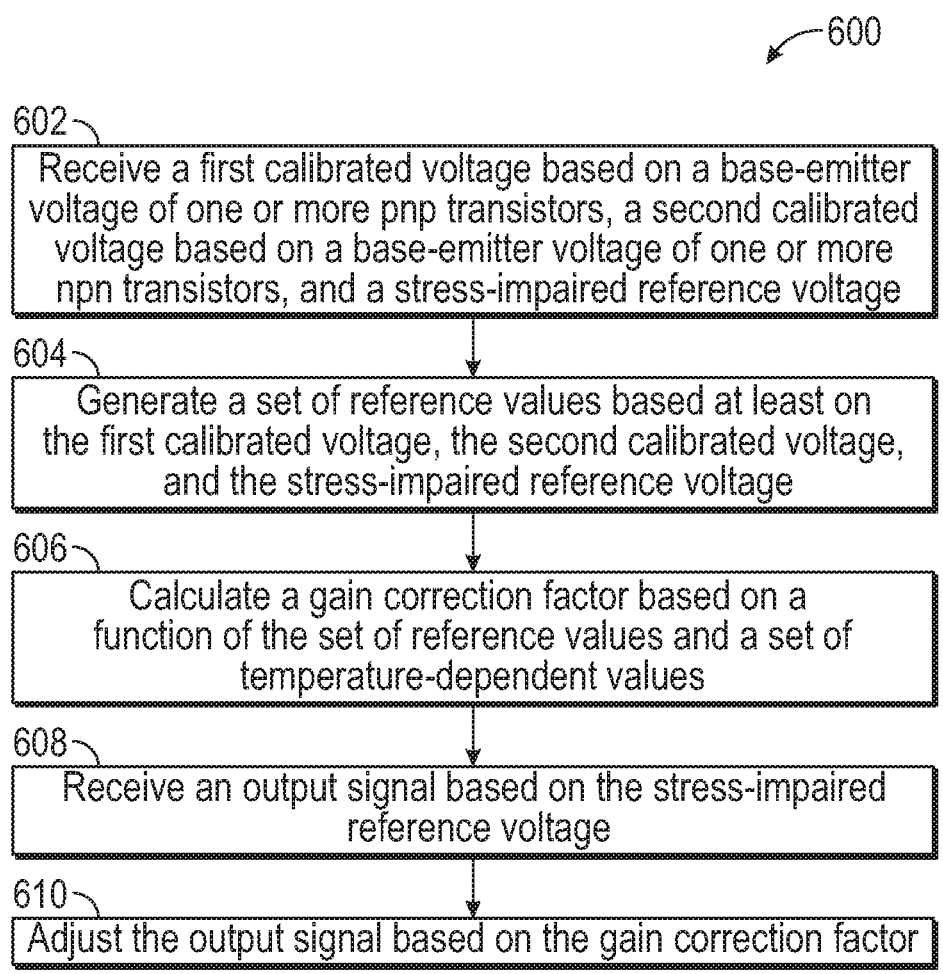
FIG. 6 is a flowchart of an exemplary process for correcting a stress-impaired signal within a circuit, according to various aspects of the present disclosure.

FIG. 6 is a flowchart of an exemplary process for correcting a stress-impaired signal within a circuit, according to various aspects of the present disclosure. For explanatory purposes, the various blocks of exemplary process 600 are described herein with reference to FIGS. 1-5, and the components and/or processes described herein. The one or more of the blocks of process 600 may be implemented, for example, by any of the various switched capacitor regulator circuits described herein. In some implementations, one or more of the blocks may be implemented apart from other blocks, and by one or more different processors or devices. Further for explanatory purposes, the blocks of exemplary process 600 are described as occurring in serial, or linearly. However, multiple blocks of exemplary process 600 may occur in parallel. In addition, the blocks of exemplary process 600 need not be performed in the order shown and/or one or more of the blocks of exemplary process 600 need not be performed.

In the depicted exemplary flow diagram, ADC 202 receives, from calibration circuit 208, a first calibrated voltage based on a base-emitter voltage of one or more pnp transistors (e.g., Vcal_pnp), a second calibrated voltage based on a base-emitter voltage of one or more npn transistors (e.g., Vcal_npn), and a stress-impaired reference voltage (e.g., Vref) (602). ADC 202 may also receive a voltage that is proportional to absolute temperature (e.g., a "calibrated PTAT voltage" or Vptat) based on a base-emitter voltage of one of the pnp transistors. According to various implementations, these voltages are initially generated by calibration circuit 208, selected by multiplexer 206, and converted to a digital value by ADC 202.

According to various implementations, calibration circuit 208 may operate first and second pnp transistors in a matched pair configuration based on a first base current through a first base of the first pnp transistor and a second base current through a second base of the second pnp transistor, the one or more pnp transistors comprising the first and second pnp transistors. Calibration circuit 208 may further generate an initial proportional-to-temperature voltage (an "initial PTAT voltage") at a first node of a voltage divider (e.g., n1), connected at the first base of the first pup transistor, based on removing a current equal to the first base current (e.g., IbaseQ1) from the voltage divider. The removed current may be based on, for example, a difference between a first voltage potential (e.g., Vn1) at the first base of the first pnp transistor and a second voltage potential (e.g., Vn4) based on a resistor connected to a second base of the second pnp transistor. The calibrated PTAT voltage may be based on a function of the initial PTAT voltage. The first calibrated voltage may be generated based on a sum of the base-emitter voltage of one of the pnp transistors and the calibrated PTAT voltage.

ADC 202 generates a set of reference values based at least our the first calibrated voltage, the second calibrated voltage, and the stress-impaired reference voltage (604). A first reference value of the set of reference values may be determined based on the first calibrated voltage and the stress-impaired reference voltage, and a second reference value of the set of reference values may be determined based on the second calibrated voltage and the stress-impaired reference voltage. A third reference value of the set of reference values may be determined based on the calibrated PTAT voltage and the stress-impaired reference voltage.

Processing unit 210 calculates a gain correction factor based on a function of the set of reference values and a set of temperature-dependent values (606). In some implementations, a temperature is calculated based on an initial gain correction value and a first reference value of the set of reference values. The set of temperature-dependent values may be calculated based on the calculated temperature. In some implementations, determining the set of temperature-dependent values may be based on indexing a lookup table by the calculated temperature. When calculating the gain correction factor, processing unit 210 may repeat the calculation of the temperature, the set of temperature-dependent values, and the gain correction factor until the temperature and the gain correction factor converge to respective values. In this regard, each temperature calculation may be based on a last-calculated gain correction factor.

In some implementations, calculating the gain correction factor may include multiplying each temperature-dependent value in the set of temperature-dependent values by a respective reference value of the set of reference values, summing each result, and determining a reciprocal of the sum. In some implementations, calculating the gain correction factor may include generating one or more polynomial equations based on the set of reference values the set of temperature-dependent values, the first calibrated voltage, the second calibrated voltage, the calibrated PTAT voltage, and the stress-impaired reference voltage, and solving for unknown values within the polynomial equations. For example, two polynomial equations may be solved for unknown gain correction factor G and a change in stress $\Delta\sigma$.

Processing unit 210 receives an output signal based on the stress-impaired reference voltage (608), and adjusts (e.g., corrects) the output signal based on the gain correction factor (610). As described previously, since device temperature T by way of the foregoing calculations is a corrected value, the various systems of the present disclosure may function as a stress-compensated integrated temperature sensor by providing T as an output value.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, implementations and practices according to the disclosed aspects can include a non-transitory computer readable media embodying a method for de-duplication of a cache. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method, comprising:
receiving a first calibrated voltage based on a base-emitter voltage of one or more pnp transistors, a second calibrated voltage based on a base-emitter voltage of one or more npn transistors, and a reference voltage;
determining a set of reference values based on the first calibrated voltage, the second calibrated voltage, and the reference voltage;
calculating a gain correction factor based on a function of the set of reference values and a set of temperature-dependent values;
receiving an output signal based on the reference voltage; and
adjusting the output signal based on the gain correction factor.

2. The method of claim 1, further comprising:
calculating a temperature based on an initial gain correction value and a first reference value of the set of reference values;
calculating the set of temperature-dependent values based on the calculated temperature; and
repeating the calculation of the temperature, the set of temperature-dependent values, and the gain correction factor until the temperature and the gain correction factor converge to respective values, wherein each temperature calculation is based on a last-calculated gain correction factor.

3. The method of claim 2, further comprising:
determining the set of temperature-dependent values based on indexing a lookup table by the calculated temperature;
wherein calculating the gain correction factor comprises multiplying each temperature-dependent value in the set of temperature-dependent values by a respective reference value of the set of reference values, summing each result, and determining a reciprocal of the sum.

4. The method of claim 1, further comprising:
receiving a first voltage that is proportional to absolute temperature based on a base-emitter voltage of one of the pnp transistors,
wherein a first reference value of the set of reference values is determined based on the first calibrated voltage and the reference voltage,
wherein a second reference value of the set of reference values is determined based on the second calibrated voltage and the reference voltage,
wherein a third reference value of the set of reference values is determined based on the first voltage and the reference voltage.

5. The method of claim 4, wherein calculating the gain correction factor comprises:
determining the gain correction factor from one or more polynomial equations based on the set of reference values the set of temperature-dependent values, the first calibrated voltage, the second calibrated voltage, the first voltage, and the reference voltage.

6. The method of claim 4, wherein the first calibrated voltage corresponds to a sum of the base-emitter voltage of the one or more pnp transistors and the first voltage.

7. The method of claim 6, wherein the first calibrated voltage, the second calibrated voltage, and the first voltage are generated by a reference circuit, the reference circuit configured to:
operate first and second pnp transistors in a matched pair configuration based on a first base current through a first base of the first pnp transistor and a second base current through a second base of the second pnp transistor, the one or more pnp transistors comprising the first and second pnp transistors; and
generate an initial proportional-to-absolute-temperature (PTAT) voltage at a first node of a voltage divider, connected at the first base of the first pnp transistor, based on removing a current based on the first base current from the voltage divider,
wherein the first voltage is based on a function of the initial PTAT voltage.

8. The method of claim 7, wherein the removed current is based on a difference between a first voltage potential at the first base of the first pap transistor and a second voltage potential based on a resistor connected to a second base of the second pnp transistor.

9. The method of claim 7, wherein a multiplexer provides, to an analog-to-digital converter, an analog signal selected from the first calibrated voltage, the second calibrated voltage, the first voltage, and one or more analog input signals,
wherein the analog-to-digital converter generates each respective reference value of the set of reference values based on the reference voltage and a selected one of the first calibrated voltage, the second calibrated voltage, and the first voltage, and generates the output signal based on the reference voltage and the analog input signal, and
wherein a processor receives the set of reference values and the output signal from the analog-to-digital converter, calculates the gain correction factor, and adjusts the output signal based on the gain correction factor.

10. The method of claim 1, wherein the reference voltage is a stress-impaired reference voltage.

11. A circuit, comprising:
means for receiving a first calibrated voltage based on a base-emitter voltage of one or more pnp transistors, a second calibrated voltage based on a base-emitter voltage of one or more npn transistors, and a reference voltage;
means for determining a set of reference values based on the first calibrated voltage, the second calibrated voltage, and the reference voltage;
means for calculating a gain correction factor based on a function of the set of reference values and a set of temperature-dependent values;
means for receiving an output signal based on the reference voltage; and
means for correcting the output signal based on the gain correction factor.

12. The circuit of claim 11, wherein the reference voltage is a stress-impaired reference voltage.

13. A system for calibrating an output signal, comprising:
a calibration circuit providing a first calibrated pnp voltage based on a base-emitter voltage of one or more pnp transistors and a second calibrated npn voltage based on a base-emitter voltage of one or more npn transistors;
a multiplexer connected to the calibration circuit and a sense terminal, and configured to provide an analog signal selected from a sense signal at the sense terminal, the first calibrated pnp voltage, and the second calibrated npn voltage; and
an analog-to-digital converter configured to generate a digital output signal based on the analog signal selected by the multiplexer and a reference voltage;
a processor, the processor configured to:
control the multiplexer to sample the first calibrated pnp voltage, the second calibrated npn voltage, and the sense signal for the analog-to-digital converter;
receive a set of reference values from the analog-to-digital converter based on the reference voltage and a sampling of the first calibrated pnp voltage and the second calibrated npn voltage by the multiplexer;
calculate a gain correction factor based on a set of reference values and a set of temperature-dependent values;
adjust the digital output signal based on the gain correction factor to correct for errors introduced by the reference voltage.

14. The system of claim 13, wherein the processor is further configured to:
   calculate a temperature based on an initial gain correction value and a first reference value of the set of reference values;
   calculate the set of temperature-dependent values based on the calculated temperature; and
   repeat calculations of the temperature, the set of temperature-dependent values, and the gain correction factor until the temperature and the gain correction factor converge to respective values, wherein each temperature calculation is based on a last-calculated gain correction factor.

15. The system of claim 14, wherein the processor is further configured to:
   determine the set of temperature-dependent values based on indexing a lookup table by the calculated temperature;
   wherein calculating the gain correction factor comprises multiplying each temperature-dependent value in the set of temperature-dependent values by a respective reference value of the set of reference values, summing each result, and determining a reciprocal of the sum.

16. The system of claim 14, wherein the processor is further configured to:
   provide an output temperature value based on a convergence of the repeated calculations of the temperature.

17. The system of claim 13, wherein the calibration circuit further provides a first voltage that is proportional to absolute temperature based on the base-emitter voltage of one of the pnp transistors,
   wherein a first reference value of the set of reference values is determined based on the first calibrated pnp voltage and the reference voltage,
   wherein a second reference value of the set of reference values is determined based on the second calibrated npn voltage and the stress-impaired reference voltage, and
   wherein a third reference value of the set of reference values is determined based on the first voltage and the reference voltage.

18. The system of claim 17, wherein the gain correction factor is determined from one or more polynomial equations based on the set of reference values the set of temperature-dependent values, the first calibrated pnp voltage, the second calibrated npn voltage, the first voltage, and the reference voltage.

19. The system of claim 18, wherein the first calibrated pnp voltage corresponds to a sum of the base-emitter voltage of the one or more pnp transistors and the first voltage.

20. The system of claim 19, wherein the calibration circuit is configured to:
   operate first and second pnp transistors in a matched pair configuration based on a first base current through a first base of the first pnp transistor and a second base current through a second base of the second pnp transistor, the one or more pnp transistors comprising the first and second pnp transistors; and
   generate an initial proportional-to-absolute-temperature voltage (PTAT) at a first node of a voltage divider, connected at the first base of the first pnp transistor, based on removing a current based on the first base current from the voltage divider,
   wherein the first voltage is based on a function of the initial PTAT voltage.

21. The system of claim 20, wherein the removed current is based on a difference between a first voltage potential at the first base of the first pnp transistor and a second voltage potential based on a resistor connected to a second base of the second pnp transistor.

22. The system of claim 20, wherein the multiplexer provides an analog signal selected from a sense signal at the sense terminal, the first calibrated pnp voltage, the second calibrated npn voltage, and the first voltage,
   wherein the analog-to-digital converter generates each respective reference value of the set of reference values based on the reference voltage and a selected one of the first calibrated pnp voltage, the second calibrated npn voltage, and the first voltage.

23. The system of claim 13, wherein the reference voltage is a stress-impaired reference voltage.

* * * * *